US007178072B2

(12) United States Patent
Mullins et al.

(10) Patent No.: US 7,178,072 B2
(45) Date of Patent: Feb. 13, 2007

(54) METHODS AND APPARATUS FOR STORING MEMORY TEST INFORMATION

(75) Inventors: Michael A. Mullins, Durham, NC (US); Anthony J. Sauvageau, Raleigh, NC (US)

(73) Assignee: Renesas Technology America, Inc., Cypress, CA (US)

( * ) Notice: Subject to any disclaimer, the term of this patent is extended or adjusted under 35 U.S.C. 154(b) by 515 days.

(21) Appl. No.: 10/160,640

(22) Filed: May 31, 2002

(65) Prior Publication Data

US 2003/0005353 A1 Jan. 2, 2003

Related U.S. Application Data

(60) Provisional application No. 60/296,789, filed on Jun. 8, 2001.

(51) Int. Cl.
G11C 29/00 (2006.01)
(52) U.S. Cl. ...................................... 714/711
(58) Field of Classification Search ............. 714/710, 714/711, 718, 719, 720, 722, 723; 365/200
See application file for complete search history.

(56) References Cited

U.S. PATENT DOCUMENTS 6,795,942 B1 * 9/2004 Schwarz ................. 714/718

FOREIGN PATENT DOCUMENTS

| JP | 10-222999 | 8/1998 |
|---|---|---|
| JP | 2000-348498 | 12/2000 |
| JP | 2001-043698 | 2/2001 |

OTHER PUBLICATIONS

U.S. Appl. No. 10/164,513, filed Jun. 6, 2002, Mullins et al.

* cited by examiner

*Primary Examiner*—James C Kerveros
(74) *Attorney, Agent, or Firm*—Buchanan Ingersoll & Rooney, PC

(57) ABSTRACT

A method for storing memory test information includes the steps of storing a portion of information related to locations and numbers of failed memory cells detected while testing memory, and updating the stored information as failed memory cells are detected to indicate a first type of memory spare is to be assigned to repair a failed memory cell, a second complementary type of memory spare is to be assigned to repair the failed memory cell, or the memory is not repairable. The first type of memory spare corresponds to one of a row and a column portion of memory and the second complementary type of memory spare corresponds to the other of the row and column portions of memory.

42 Claims, 9 Drawing Sheets

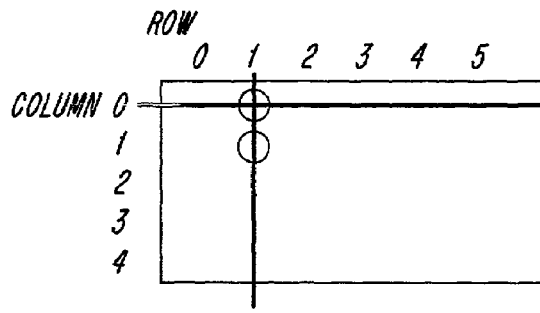
FIG. 2A
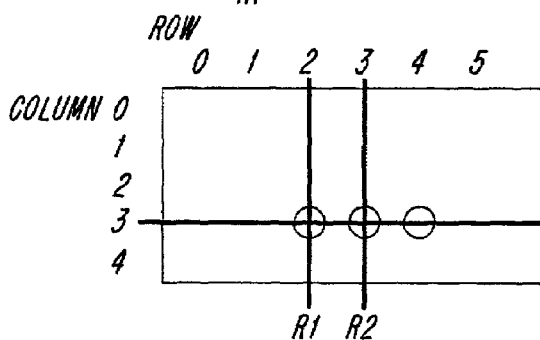
FIG. 2B
FIG. 3A
ROW UPDATE TABLE
| ERROR COUNT | ROW ADDRESS | I/O ID |
|---|---|---|
|  |  |  |
|  |  |  |
|  |  |  |
|  |  |  |
2 BITS / 7 BITS / 2 BITS
FIG. 3B
I/O UPDATE TABLE
| | ERROR COUNT | I/O ADDRESS |
|---|---|---|
| CID=0 |  |  |
| CID=1 |  |  |
| CID=2 |  |  |
| CID=3 | MULTIPLE I/O ERRORS($\geq 2$) | |
2 BITS / 5 BITS

FIG. 4B

ERROR LIST

|   | R  | C |
|---|----|---|
| A = | 4  | 1 |
| B = | 8  | 3 |
| C = | 10 | 1 |
| D = | 16 | 2 |
| E = | 20 | 1 |
| F = | 14 | 1 |
| G = | 7  | 1 |
| H = | 9  | 1 |
| I = | 17 | 2 |
| J = | 11 | 4 |

FIG. 4A

ROW  0-3  4-7  8-11  12-15  16-19  20-23
      0    1    2     3      4      5

COLUMN 0
       1      Ⓐ   Ⓒ   Ⓕ          Ⓔ
              G    H
       2                      Ⓓ
                               I
       3           Ⓑ
       4           Ⓙ

FIG. 5A

| | ERROR COUNT | ROW ADDRESS | COLUMN ID |
|---|---|---|---|
| STEP 1 | 1 | 1 | 0 |
| STEP 2 | 1 | 2 | 1 |
| | | | |
| | | | |

| | ERROR COUNT | COLUMN ADDRESS |
|---|---|---|
| ID=0 | 1 | 1 |
| ID=1 | 1 | 3 |
| ID=2 | | |

FIG. 5B

| | ERROR COUNT | ROW ADDRESS | COLUMN ID |
|---|---|---|---|
| | 1 | 1 | 0 |
| STEP 3 | ̶1̶ 2 | 2 | 1 |
| STEP 4 | 1 | 4 | 2 |
| STEP 5 | 1 | 5 | 0 |

| | ERROR COUNT | COLUMN ADDRESS | |
|---|---|---|---|
| ID=0 | ̶1̶ 2 | 1 | STEP 5 |
| ID=1 | 1 | 3 | |
| ID=2 | 1 | 2 | |

FIG. 5C

| | ERROR COUNT | ROW ADDRESS | COLUMN ID |
|---|---|---|---|
| | 1 | 1 | 0 |
| | 2 | 2 | 1 |
| | 1 | 4 | 2 |
| | 1 | 5 | 0 |

| | ERROR COUNT | COLUMN ADDRESS | |
|---|---|---|---|
| ID=0 | ̶2̶ 3 | 1 | STEP 6 |
| ID=1 | 1 | 3 | |
| ID=2 | 1 | 2 | |

SUB-BLOCK DIAGRAM

METHODS AND APPARATUS FOR STORING MEMORY TEST INFORMATION

RELATED APPLICATIONS

This application claims priority under 35 U.S.C. § 119(e) to U.S. Patent Application No. 60/296,789, entitled "Error Storage", filed on Jun. 8, 2001, the entire content of which is hereby incorporated by reference.

BACKGROUND

What is described are methods and apparatus for storing memory test information. In particular, methods and apparatus for storing memory test information of memory having redundant memory circuitry are presented.

Conventional memory testing involves both an identification of all failed memory addresses in a memory array and an identification of which bit(s) of those memory addresses have failed. A typical memory test involves writing various data patterns into a memory, then reading and comparing the output of the memory with expected values or patterns. Mismatches between expected and actual read memory values are stored in an external memory map, typically located in the memory tester itself.

After all of the test patterns have been executed and the failed addresses (and bits) have been identified and stored, the tester may then perform a repair analysis on the stored error data to determine which failed address rows' and/or columns' (or I/Os) bits (or cells) will need to be replaced with available redundant (or spare) memory cells to make the memory fully operational. The failed memory information is typically analyzed at the end of all of the memory testing. This allows the repair algorithm to take all of the failed memory information into consideration in order to determine an optimal repair configuration that maximizes the operation of the memory and that uses the redundant memory cells in the most efficient manner. In addition, by taking all failed memory information into consideration at one time, certain un-repairable memory conditions may be identified early, and the memory discarded, before wasting valuable test and repair time on the un-repairable situation.

Limitations associated with most conventional testers require that the repair information be generated and used dynamically. This can reduce the overall memory yield by using the redundant memory cells inefficiently. These limitations have also made memory testing a most expensive and time consuming process in the development of faster and denser memory.

For example, conventional memory testers typically have a relatively slower processing clock speed than the operating frequency of the memory cells that they are used to test. The relatively slower clock speed makes it impossible to determine whether the memory under test will operate correctly at normal operating speeds. Also, collecting error information at the normal operating speed is not possible using these slower conventional testers. Consequently, the tester must be capable of storing large amounts of error data and then analyzing this large amount of data in a repair algorithm that is executed "off line". With conventional testers, the error memory must be as large as the total expected number of failed bits. Moreover, as memory densities continue to increase, the already limited tester memory must also increase and the processing power of the tester must be increased in order to be able to process more complex repair algorithm solutions.

Another limitation associated with conventional testers is their typical limited I/O capability. As memory become more dense, the number of I/Os needed to test the memory must also increase. Testers that are I/O limited will not be able to test the entire memory at one time, requiring that the test program be partitioned into several smaller tests. The partitioning of the memory test leads to an overall increased test time, which contributes greatly to the costs associated with memory manufacture.

Memory designers have utilized built-in-self-test (or BIST) techniques to address some of these concerns. With BIST, a pattern generator for testing the memory is fabricated on the same semiconductor chip (or wafer) as the memory itself. This allows the BIST circuitry to test the memory "at speed", eliminating the concerns of failing to detect errors as a result of testing memory at sub-operating speeds. In addition, BIST circuitry addresses the concerns associated with today's testers being I/O limited.

Still, limitations exist with conventional BIST techniques. For example, large amounts of error memory must still be incorporated into the BIST circuitry in order to store the failed memory information. Also, additional storage and processor resources must be incorporated into the memory to perform the repair algorithm processing. Because of space and processor limitations, only limited amounts of error storage and repair code can integrated into the BIST design. Consequently, conventional BIST techniques continue to use a "snapshot approach" for detecting failed memory locations. This requires that the repair algorithm process failed memory information "on the fly", which, as discussed above, leads to an inefficient use of the redundant memory cells included on the memory chip.

Accordingly, there is a need for improved techniques for storing the failed memory information generated from memory testing that will relieve the error storage requirements placed on the tester and that will reduce the complexity of the repair algorithm to a much simpler task. In particular, there is a need for improved techniques for storing only that failed memory information that is necessary to completely analyze and generate the repair information.

SUMMARY

Accordingly, one object is to provide for on-chip storage of all failed memory information in an efficient manner. Another object is to provide for at-speed storage of all failed memory information. Yet another object is to support the testing of memory having a large number of I/O bus memory. Still another object is to detect certain un-repairable memory failure conditions before initiating a repair algorithm. Another object is to reduce the complexity of the repair algorithm itself. These objects are addressed by methods and apparatus to compact information relating to failed memory locations with a memory.

According to one aspect, a method for storing memory test information includes the step of storing a portion of information related to locations and numbers of failed memory cells detected while testing memory. The stored information is updated as failed memory cells are detected to indicate a first type of memory spare is to be assigned to repair a failed memory cell, a second complementary type of memory spare is to be assigned to repair the failed memory cell, or the memory is not repairable. The first type of memory spare corresponds to one of a row and a column portion of memory and the second complementary type of memory spare corresponds to the other of the row and column portions of memory.

According to a related aspect, the stored information is updated to indicate the type of memory spare to be assigned to repair the failed memory cell based in part on whether a number of failed memory cells in a respective row or column portion of memory where the failed memory cell is located exceeds a number of available complementary type memory spares.

According to yet another related aspect, the information is stored in a table having row and column portions, each row and column portion of the table including at least one address/error-count entry pair for storing an address of the respective row or column portion of memory where the failed memory cell is located and the number of failed memory cells detected in the respective row or column portion of memory.

According to yet another related aspect, the method further includes the step of determining if a match exists between at least one of the addresses of the row and column portions of memory where the failed memory cell is located and an address entry stored in the table.

According to yet another related aspect, if a match exists, the method further includes the step of incrementing the error-count entry paired with the matching address entry if the paired error-count entry is equal to the number of available complementary type memory spares. If a match exists in both the row and column portions of the table, the method further includes the step of incrementing the error-count entries paired with the matching address entries if the paired error-count entries are each less than the respective number of available complementary type memory spares.

According to yet another related aspect, if a match exists in one of the row and column portions of the table, the method further includes the step of determining if the row or column portion of the table not including the matching address entry is full. If the row or column portion of the table not including the matching address entry is not full, the method further includes the steps of incrementing the error-count entry paired with the matching address entry if the paired error-count entry is less than the number of available complementary type memory spares, and adding an address/error-count entry pair to the portion of the table not including the matching address entry, the added entry pair including the address of the row or column portion of memory where the failed memory cell is located not matching an address entry in the table and an error-count of one. If the row or column portion of the table not including the matching address entry is full, the information stored in the table is updated to indicate that the memory is not repairable.

According to yet another related aspect, if no match exists, the method further includes the step of determining if at least one of the row and column portions of the table are full. If neither of the row or column portions of the table are full, the method further includes the step of adding an address/error-count entry pair to both the row and column portions of the table, each added entry pair including the respective address of the row or column portion of memory where the failed memory cell is located and an error-count of one. If at least one of the row and column portions of the table are full, the information stored in the table is updated to indicate that the memory is not repairable.

According to yet another related aspect, if a total number of one type of memory spare is greater than a total number of complementary type memory spares, the step of determining if a match exists includes the step of comparing the address of the row or column portion of memory corresponding to the type of memory spare having the greater total number of spares with address entries in the table before comparing the address of the row or column portion of memory corresponding to the type of memory spare having a lesser total number of spares with address entries in the table.

According to yet another related aspect, if the total number of the first and second types of memory spares are equal, the step of determining if a match exists includes the steps of selecting one of the addresses of the row and column portions of memory where the failed memory cell is located at random, and comparing the address of the row or column portion of memory selected at random with address entries in the table before comparing the address of the row or column portion of memory not selected at random with address entries in the table.

According to yet another related aspect, the method further includes the step of linking address/error-count entry pairs included in the row portion of the table with associated address/error-count entry pairs included in the column portion of the table. A link identifier entry for storing a unique link ID is added to each address/error-count pair of the row or column portion of the table corresponding to the type of memory spare having a greater total number of spares for linking address/error-count entry pairs included in the row portion of the table with associated address/error-count entry pairs included in the column portion of the table. The number of unique link IDs is equal to the number of memory spares of the type having a lesser total number of spares.

According to yet another related aspect, the table represents a portion of memory where at least one of the first type of memory spare intersects at least one of the second complementary type of memory spare.

It should be emphasized that the terms "comprises" and "comprising", when used in this specification as well as the claims, are taken to specify the presence of stated features, steps or components; but the use of these terms does not preclude the presence or addition of one or more other features, steps, components or groups thereof.

BRIEF DESCRIPTION OF THE DRAWINGS

The above objects, features, and advantages will become more apparent in light of the following detailed description in conjunction with the drawings, in which like reference numerals identify similar or identical elements, and in which:

FIGS. 2A and 2B illustrate the repair of detected memory cell failures using available memory spares;

FIGS. 3A and 3B illustrate row and column portions of an error storage table;

FIGS. 4A and 4B illustrate an exemplary portion of memory having a number of detected failed memory locations;

FIGS. 5A, 5B, and 5C illustrate various stages of the error storage process for the exemplary portion of memory shown in FIGS. 4A and 4B;

DETAILED DESCRIPTION

Figure 1:
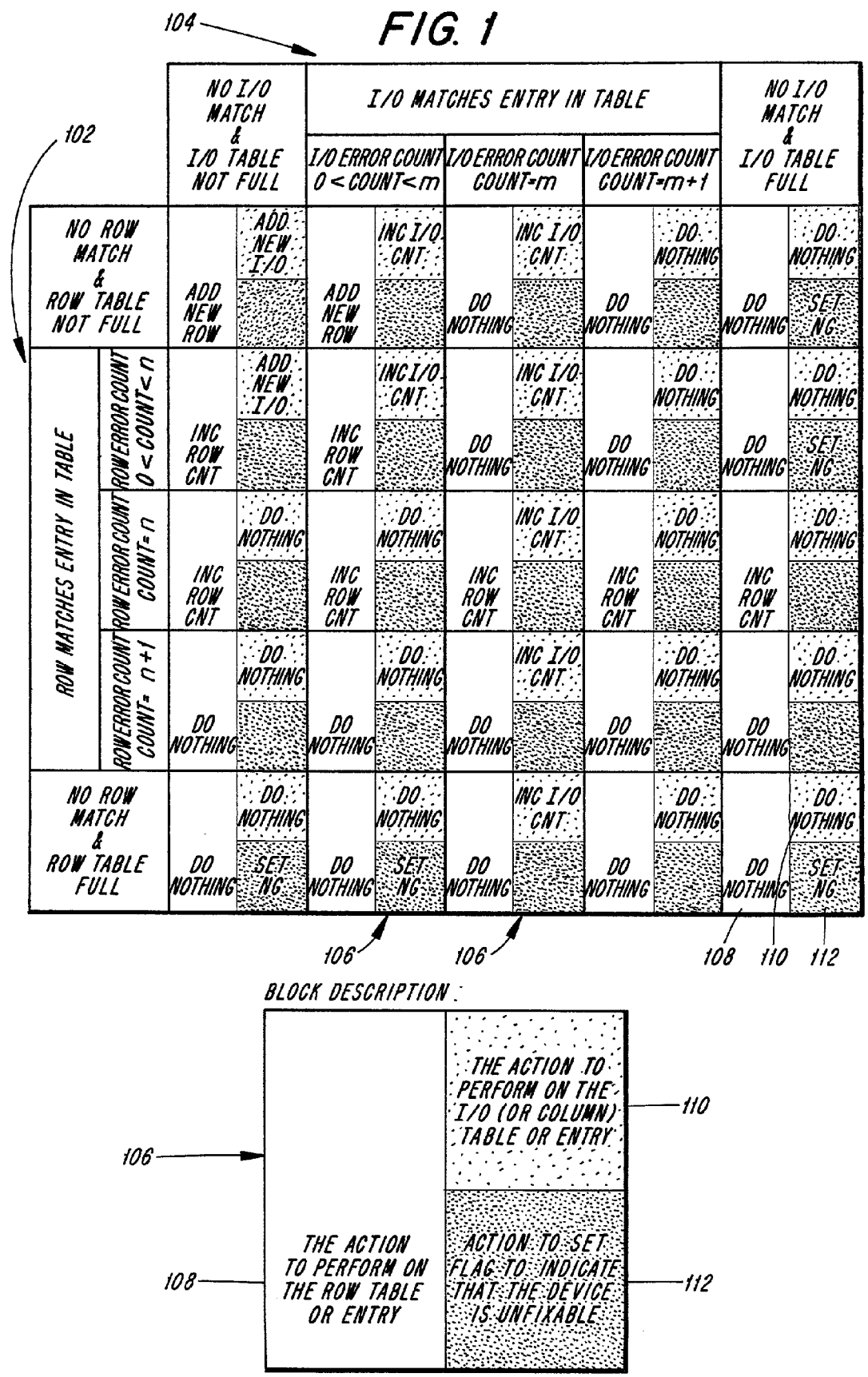
FIG. 1 illustrates a generalized error storage decision chart.

Preferred embodiments are described below with reference to the accompanying drawings. In the following description, well-known functions and/or constructions are not described in detail to avoid obscuring the description in unnecessary detail.

Redundant Circuitry

As briefly described above, the redundant circuitry included to effect memory repair is made up of memory arrays that can replace failed memory locations by multiplexing (or mapping) spare memory cells to the identified failed memory locations. Repair information from a repair algorithm indicates how to map the spare row or column cells to the failed memory location. An efficient algorithm for repairing failed memory locations is described in the copending U.S. Patent Application No. 60/296,793 titled "Repair Analysis Algorithm Suitable for On-Chip Implementation", having a common assignee as this application, the corresponding utility application being filed the same day as this application.

Only one spare memory cell is required to fix any given failed memory bit. Typically, spare memory cell circuits are constructed with addressable row spare cells and column spare cells. In such arrangements, all memory bits associated with a given row address are replaced when a spare row is mapped to the location. Likewise, mapping a spare column into the memory will replace all memory bits included in that column. Each intersection of a row and column address selects a group of memory bits (or cells).

Other redundant circuitry arrangements are capable of mapping spare I/Os as well. These configurations group several column memory arrays into one output driver. This enables an individual data bit existing in multiple column addresses to be replaced with a single spare column. Spare columns replace a group of I/O's for a column address. Accordingly, the term "column" is used throughout this document to refer to both column and I/O-type redundant circuitry.

In memory chips having several memory cores, the spare rows and spare columns included for repairing the various memory cores may be individually configured. The number of spare rows and columns that intersect one another in a given redundant circuit is an important design criteria in determining the configuration of an error storage table associated with that redundant circuit. Each error storage table may be thought to represent one sub-block where spare rows intersect with spare columns in the particular core. Each spare row and spare column can repair a range of row and column addresses. This range defines what is referred to as an "analysis block". An analysis block's row and column address ranges divide a memory core into smaller independent regions. The spare rows and spare columns of analysis block may be shared among multiple sub-blocks. The amount sharing is dependent on the redundant architecture of the particular memory core.

In addition to being capable of repairing a range of associated row and column addresses, the sub-block also has dedicated spare rows and spare columns that can be used to repair all the failed locations within the sub-block itself. Likewise if the sub-block is configured with spare rows and spare I/Os, this same capability holds true—the sub-block has dedicated spare rows and spare I/Os that can be used to repair all of the failed locations within the sub-block.

As indicated above, the number of spare row and column cells or I/Os per sub-block can be varied across the different memory cores residing on a memory chip. Although the exemplary embodiments presented below feature memory cores that use two spare rows and one spare column (or I/O) per sub-block, those skilled in the art will understand that other arrangements using any number of spare cells or I/Os per sub-block are possible.

Error Storage Table

The error storage table is used to store only that information that is needed by the repair analysis algorithm to generate the necessary repair codes to map the identified failed memory cells to spare locations. This is to be contrasted with conventional error storage techniques that store and all of the failure information for repair processing. As discussed above, each spare cell (or I/O) covers a range of addresses, and can thus repair a number of addresses at one time.

For example, given a memory core having spare cells that can replace, e.g., four row addresses at one time, the two least significant bits (LSBs) of the address can be considered to be one address. If memory failures are identified on row address one and row address three of a memory core, the spare row will replace row addresses zero, one, two, and three. The error storage table thus interprets row addresses zero, one, two, and three as the same address. This is but one method of reducing the amount of failed memory information that can be stored to drive the repair analysis algorithm.

FIG. 1 depicts a generalized error storage decision chart. Specific decision charts may be derived from the generalized chart based on the numbers of available spare rows and columns (or I/Os) in any given redundant circuitry structure. Important to the error storage table are the rules which govern its table entries. These rules are based on the number of spares available in the sub-block the table represents.

Two general rules govern the chart entries. First, if a number of failures on a given column address exceeds the number of available spare rows, then a spare column must be used. This situation is depicted in FIG. 2A. Second, if the number of failures on a given row address exceeds the number of available spare columns (or I/Os), then a spare row must be used. This situation is depicted in FIG. 2B. For the case where spare I/Os are available, an additional table entry rule is required—when multiple I/Os have failures at the same address and the number of available spare I/Os are exceeded, then a spare row must be used.

With these general rules in mind, the chart shown in FIG. 1 is arranged generally to have I/O (or column) information spanning horizontally, and row information spanning vertically across the chart. The vertical 102 and horizontal 104 chart headers describe the current condition of corresponding row update and column update tables, respectively (see FIGS. 3A and 3B). The headers depict whether the respective tables: 1) contain no entries that match the current row and/or column address of the failure being processed and are not full; 2) contain an entry that matches the current row and/or column address of the failure being processed; and 3) are full and contain no entries that match the current row and/or column address of the failure being processed. The headers also contain information indicating the current row and column error counts for the various table entries.

Each block 106 in the decision chart includes information that defines how the row update and column update tables should be modified based on the current table entries and the address location of the failure being processed. The lower-left block entries 108 correspond to row update table commands; upper-left cell entries 110 represent column update table commands; and the lower-right cell entry 112 is either empty or is set to "NG" to indicate that the memory core being processed is "no good" or un-repairable.

FIGS. 3A and 3B depict the row update and column (or I/O update) tables, respectively. The table sizes and size of the table entries are dependent upon the number of available spare rows and columns (or I/Os) available in a given sub-block. Continuing with the illustrative example of a sub-block having two spare rows and one spare I/O, the number of table row entries is four—two entries for each available spare row, plus two entries for each intersection of the two available spare rows with the single available spare column. Similarly, the number of table column entries is three—one entry for the single available spare column, plus two entries for each intersection of the single available spare column with the two available spare rows.

Each of the row update and column update tables includes entries for a current error count. The size of the error-count entry in the illustrative example is two bits. Each of tables also has corresponding entries for an address of the row and column failure being repaired. Finally, the row update table includes entries that link a given row repair to a corresponding column repair. For this example, the size of the column ID entry is again two bits. Details regarding the size of the error storage table and its various entries are described in detail in the section titled "Calculation of the Error Table Size" below.

Conventionally the storage of all the addresses of failed memory cells is necessary in order for the repair analysis algorithm to properly choose how to arrange the spare rows and columns to fix the sub-block. By employing the techniques described herein, each spare cell or I/O can fix several rows simultaneously, allowing several addresses to be represented as one single address in the error table. In the example that follows, each spare row can be addressed to repair four adjacent rows in the memory.

Other techniques to further reduce the required size of the error storage table include not storing redundant errors in the error table, counting the number of times a given address has an error, not storing errors determined to lie along an already needed spare row or spare column. These techniques are combined to perform a limited repair analysis during the error storage process to effect a preselection of spare cell or I/Os that must be used to repair a given memory core. The techniques also permit the early detection of un-repairable memory devices during testing, saving valuable test time and resources.

Illustrative Example

FIGS. 4A and 4B depict an illustrative example of a sub-block having a number of identified failed memory locations. FIG. 4A depicts the sub-block having ten errors labeled A through J. The table shown in FIG. 4B lists the row and column locations where the errors exist in the sub-block. As described earlier, each spare row in the example is capable of replacing four rows in the sub-block. FIGS. 5A to 5D depict the various steps performed when practicing the error storage techniques described above on the exemplary sub-block shown in FIG. 4A.

Referring to FIG. 5A, when the first error A is detected, the row and I/O tables are checked for current entries. If no entries exist, the tables are updated with a corresponding row and column entry, shown as step 1 in the FIGURE. Since error A is the first error detected on row address 4, which is mapped to address 1, the error-count is incremented to 1. A corresponding column entry is made having address 1 and an error-count of 1. The ID links the row address to the column address by position. Since the corresponding column address entry is made in location ID=0 in the I/O table, this entry is linked in the row table entry using the same ID.

The next error in the list is B. This error is located at row address 2 and column address 3 of the sub-block. Since these locations do not match any row or column entries in the row or I/O update tables, the tables are again updated with the current error information. This is shown as step 2 in the figure.

FIG. 5B shows the next stage of error processing. The next detected error in the example is error C. This error is located at row address 2 and column address 1. The location of this error matches a current entry in the row update table, so the error-count of the row update table entry having the row address 2 is incremented to 2. This is shown as step 3 in the FIGURE. Applying the general rules described above, since the error-count for row 2 exceeds the number of available column spares (one in this example) the row must be fixed by one of the two available spare rows. Since all errors on row 2 will be fixed by the assigned row spare, a corresponding entry for error C need not be added to the column table.

The next detected error is error D. This error does not match any existing error addresses and the tables are updated with the new error information. This is shown in as step 4 in the figure. Note that the column entry table is full after making the entry for error D. Thus, any additional detected errors that do not match any of the current column address entries will make this device un-repairable, allowing the testing cycle to be halted.

The next detected error in the example is error E. This error matches a current column entry in the I/O update table, but does not match any current row table entries. Accordingly, the row table is updated with the new error information. Note that the column ID the error E row table entry is set to 0 which is corresponds I/O table identifier associated with column 1. The error-count for ID=0 is incremented to 2 to record the additional detected column error. These updates are shown as step 5 in the figure.

FIG. 5C depicts the next stage of the error storage process. The next detected error in the example is error F. This error is located at row 3 and column 1 of the sub-block. The error matches a column entry (ID=0) having an error-count of 2. The error will cause the error-count for the column entry to exceed the number of available row spares. Again applying the general rules discussed above, the single available column spare is assigned to fix the error. Since the error is fixed by the assigned spare column, a corresponding entry need not be made in the row entry table.

It is important to note that if the incremented error-count (3) did not exceed the number of spare rows available (2), then the device would have been determined to be un-repairable. The reason for this is that the row entry table is full, and thus it would be impossible to update the row table to add the failed information for row address 3. The table is sized such that all repairable (and some not repairable) error patterns to fit. Thus, exceeding the table entries helps to identify un-repairable devices early in the testing process.

The next three errors in the example, errors G, H, and I, all match existing entries and are thus ignored in storage decision process. Identical errors need not be considered at all in the repair analysis process. The final error in the example, error J, is a new error, but it is repaired by a previously assigned row spare. This fact may be identified by the error-count entry in the row table. All error counts in the row entries that have the value of 2 must use a spare row, since this value exceeds the number of available spare columns. All column entries with an entry of 3 must be fixed with a column spare, since this value exceeds the number of available spare rows.

Figure 6:
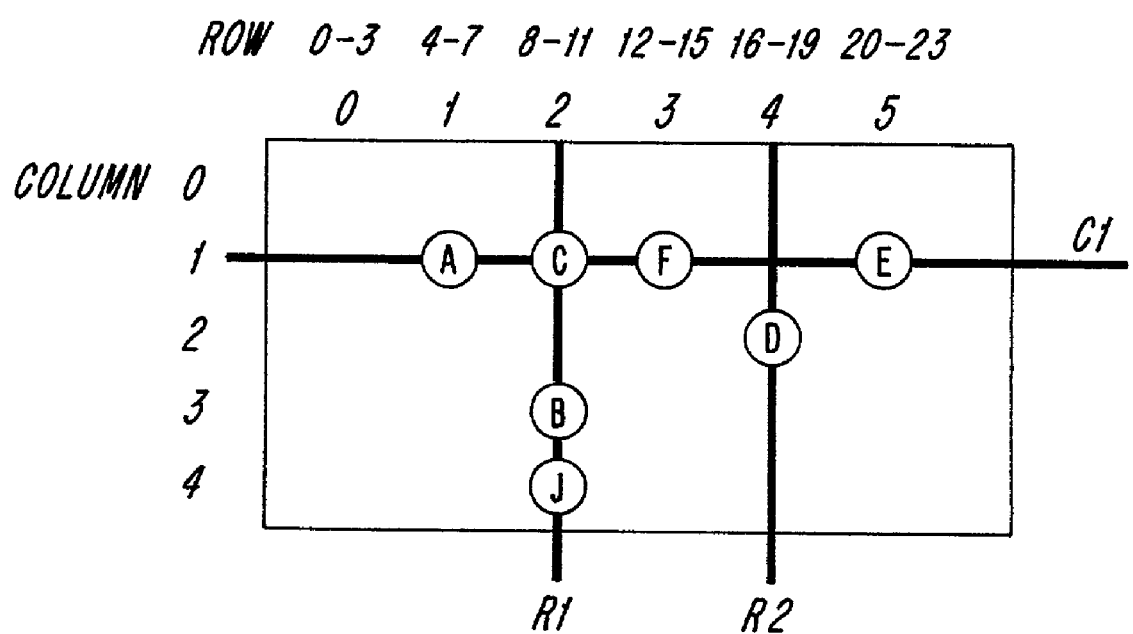
FIG. 6 illustrates the repair of the exemplary portion of memory shown in FIGS. 4A and 4B.

When the all errors have been processed and the error storage table completed, the repair analysis algorithm interprets the table results to determine if a successful repair can be effected. FIG. 6 depicts how the repair analysis may interpret the error storage table to effect a repair. Examining the column update portion of the error storage table, a spare column C1 is used to repair column address 1 since the error-count for this entry (e.g., 3) exceeds the number of available spare rows (e.g., 2). Next, one of the two available spare rows C1 is used to repair row address 2. Again, the spare row is assigned because the error-count entry for this row address (e.g, 2) exceeds the available number of spare columns (e.g., 1).

Finally, the row update portion of the error table is examined to determine how the final available spare row is to be assigned. Recall that the already assigned spare column C1 was assigned to column address 1, having a column ID=0. Accordingly, all row address error entries having a column ID=0 will be repaired by the already assigned spare column C1. An examination of the row table indicates that all but the recorded error at row address 4 is repaired by either the assigned spare column C1 or the assigned spare row C1. Accordingly, the final available spare row R2 is assigned to repair error D in row 4, and all of the errors in the sub-block are successfully repaired with spare memory cells or I/Os.

Process Flow Diagrams for Illustrated Example

Figure 7:
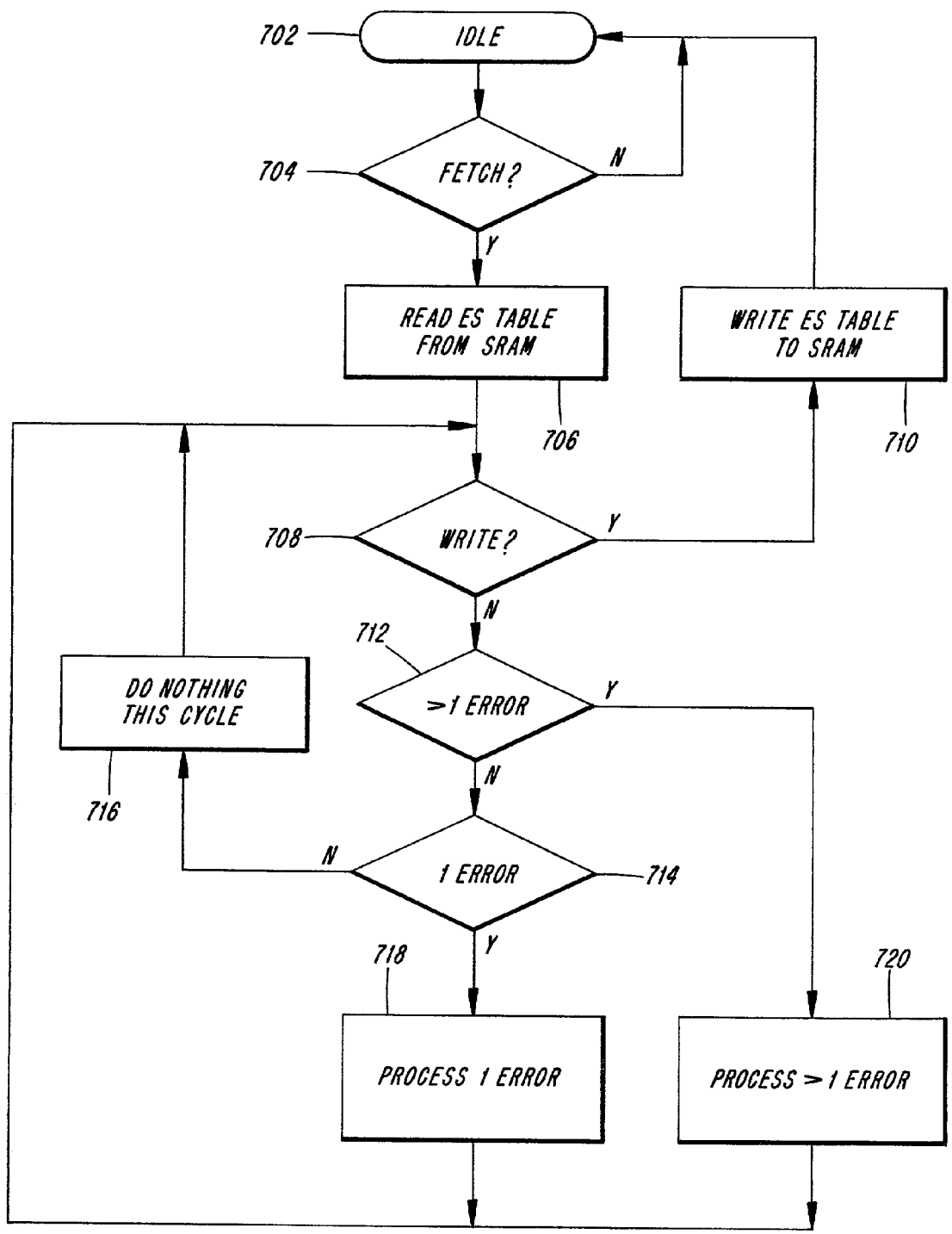
FIG. 7 illustrates a top-level flow diagram depicting an exemplary embodiment of an error storage process.

FIG. 7 is a top-level flow diagram depicting an exemplary embodiment of an error storage process. The process begins at step 702 defined as an idle mode. Next, a determination is made at step 704 whether to fetch the error storage (ES) table information from memory, e.g., from SRAM included on the memory chip. The process returns to the idle state 702 if a decision to fetch the ES information is not made, but transitions to step 706 where the ES information is read from SRAM if a decision to fetch is made. After reading the ES information from the SRAM to process transitions to step 708 where a decision to write updated ES information to the SRAM is made. If a decision to update the ES information is made, the ES table is updated at step 710 and the process returns to the idle state at step 702. If the ES table is not to be updated, error testing and processing begins at step 712.

A sub-block is tested at step 712 to determine the number error signals, if any, that are active on the I/O inputs. If more than one error signal is detected, the process transitions to step 720 and routine for processing greater than one error signal is executed. If there is one or less error signals detected, the process transitions to step 714 where a determination is made whether exactly one error signal has been detected. If exactly one error signal is detected, the process transitions to step 718, and a routine for processing exactly one error signal is executed. If no errors are detected, no action for the current cycle is taken, and the process transitions through step 716 to step 708 where a decision to update the ES table in SRAM is again made. The process of detecting and process error signals in steps 712 through step 720 are again executed.

Figure 8:
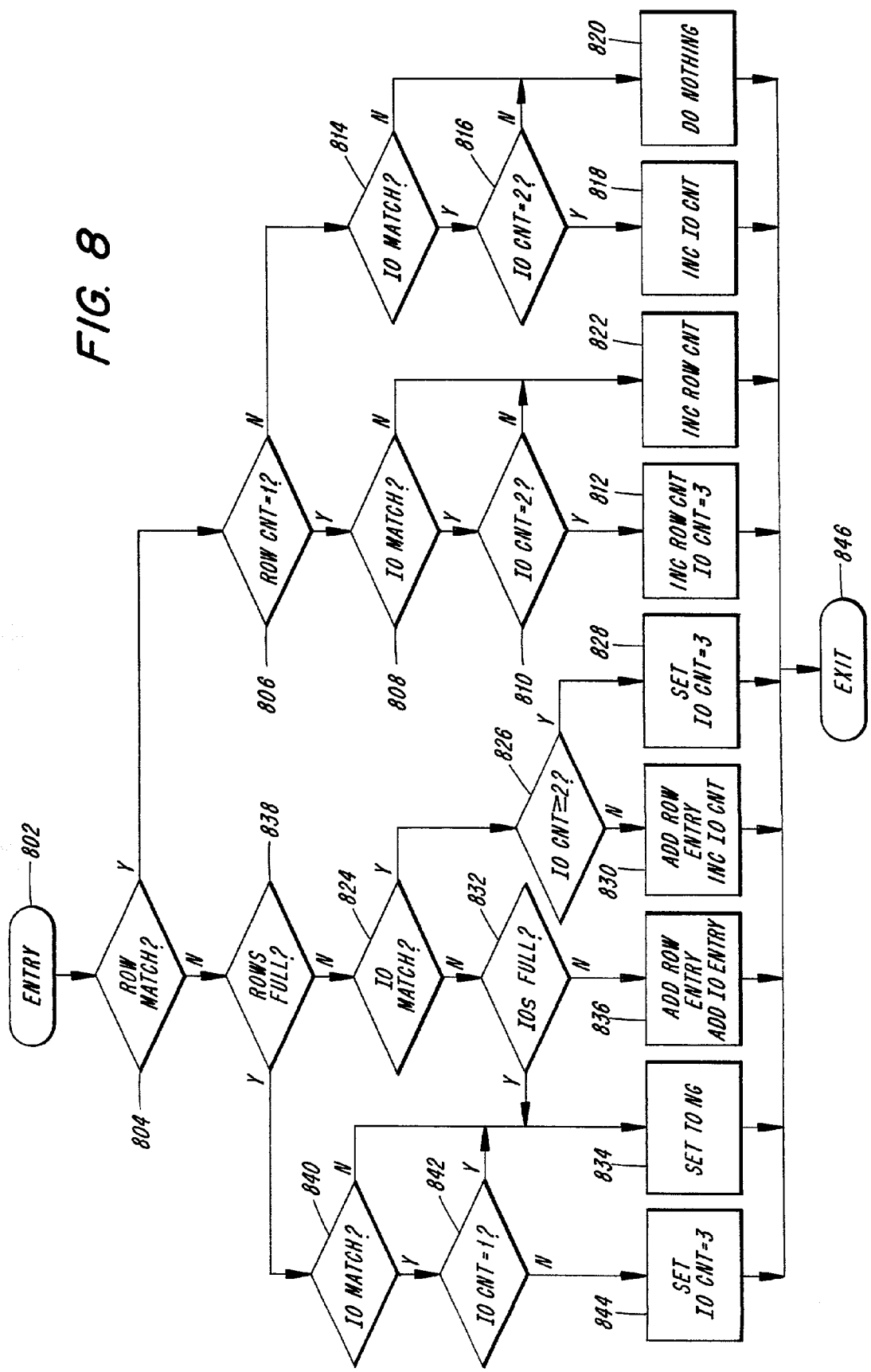
FIG. 8 illustrates a flow diagram of an exemplary routine for processing errors when only one memory cell error is detected.

FIG. 8 is a flow diagram of an exemplary routine for processing errors when only one memory cell error is detected. Some of the steps illustrated in the diagram are specific to the illustrative example that includes a redundant circuit having one spare column (or I/O) and two spare rows. It will be understood that general concepts presented in the diagram may extended to redundant circuits having any number of spare rows and columns.

The routine begins at step 802, having been called from, e.g., step 718 of the top-level process depicted in FIG. 7. The address of the error is compared with entries in the row update table at step 804 to determine if a row match exists. If a row match does exist, the routine proceeds to steps 806 through 822. In these steps, determinations are made at steps 808 and 814 as to whether a corresponding I/O address exists, and if so, whether the I/O count is equal to 2 at steps 810 and 816. If the I/O count is equal to 2, then if the row count is equal to 1, as determined in step 806, the row count is incremented and the I/O count is set to 3 at step 812. If, however, the row count is not equal to 1 in step 806, only the I/O count is incremented at step 818.

If no I/O matches are found at steps 808 and 814, or if the I/O count is not equal to 2 at steps 810 and 816, then if the row count is equal to one at step 806, only the row count is incremented at step 822. If, however, the row count is not equal to one at step 806, then no action is taken at step 820.

If a row match does not exist as step 804, the routine determines whether or not the row update table is full at step 838. If the row table is not full, the routine examines the I/O update table for an I/O address match at step 824. If an I/O address match is found, the I/O count is examined at step 826. If the I/O count is greater than 2 (the number of spare rows in the example), then the I/O count is set to 3 at step 828, otherwise a new row entry is added and the corresponding I/O count is incremented at step 830. If no I/O match is found at step 824, then a determination is made as to whether the I/O table is full at step 832. If the table is full, then the memory core being examined is tagged as being un-repairable at step 834, otherwise both a new row and I/O table entry is made at step 836.

If the row table is found to be full at step,838, the routine looks for a corresponding I/O address match at step 840. If no match is found, the memory core is again tagged as being un-repairable at step 834. If an I/O match is found, the corresponding error-count is examined at step 842. If the error I/O error-count is 1, then the memory core is tagged as being un-repairable, since no more additional space is available in the row update table. If the I/O count is equal to 1 at step 842, however, the I/O count is set to 3. Control returns to the main error processing routine shown in FIG. 7 at step 846 after each of the table updates is completed.

Figure 9:
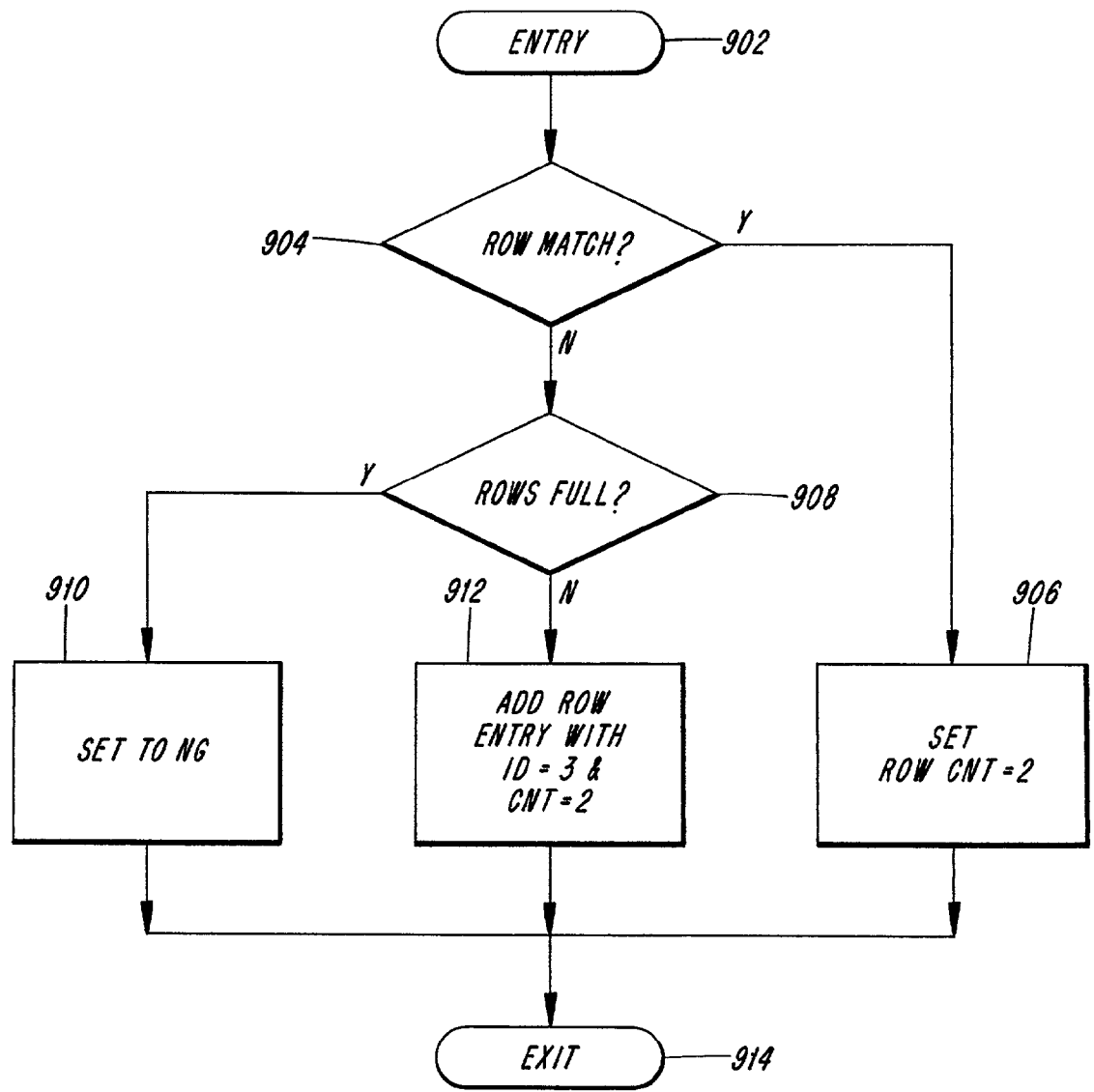
FIG. 9 illustrates a flow diagram of an exemplary routine for processing errors when more than one memory cell error is detected.

FIG. 9 is a flow diagram of an exemplary routine for processing errors when more than one memory cell error is detected. Again, some of the steps illustrated in the diagram are specific to the illustrative example that includes a redundant circuit having one spare column (or I/O) and two spare rows. As mentioned above, it will be understood that general concepts presented in the diagram may extended to redundant circuits having any number of spare rows and columns.

The routine begins at step 902, having been called from, e.g., step 718 of the top-level process depicted in FIG. 7. The row update table is examined at step 904. If a row match is found, the row error-count is set to 2 at step 906. If, however, no row match is found, a determination is made as to whether the row update full at step 908. If the table is full, the memory core being tested is tagged as being un-repairable at step 910. If the table is not full at step 908, a new row table entry is made with the column ID value set to 3 and the error-count is set to 2. Control returns to the main error processing routine shown in FIG. 7 at step 914.

Calculation of the Error Table Size

Figure 10:
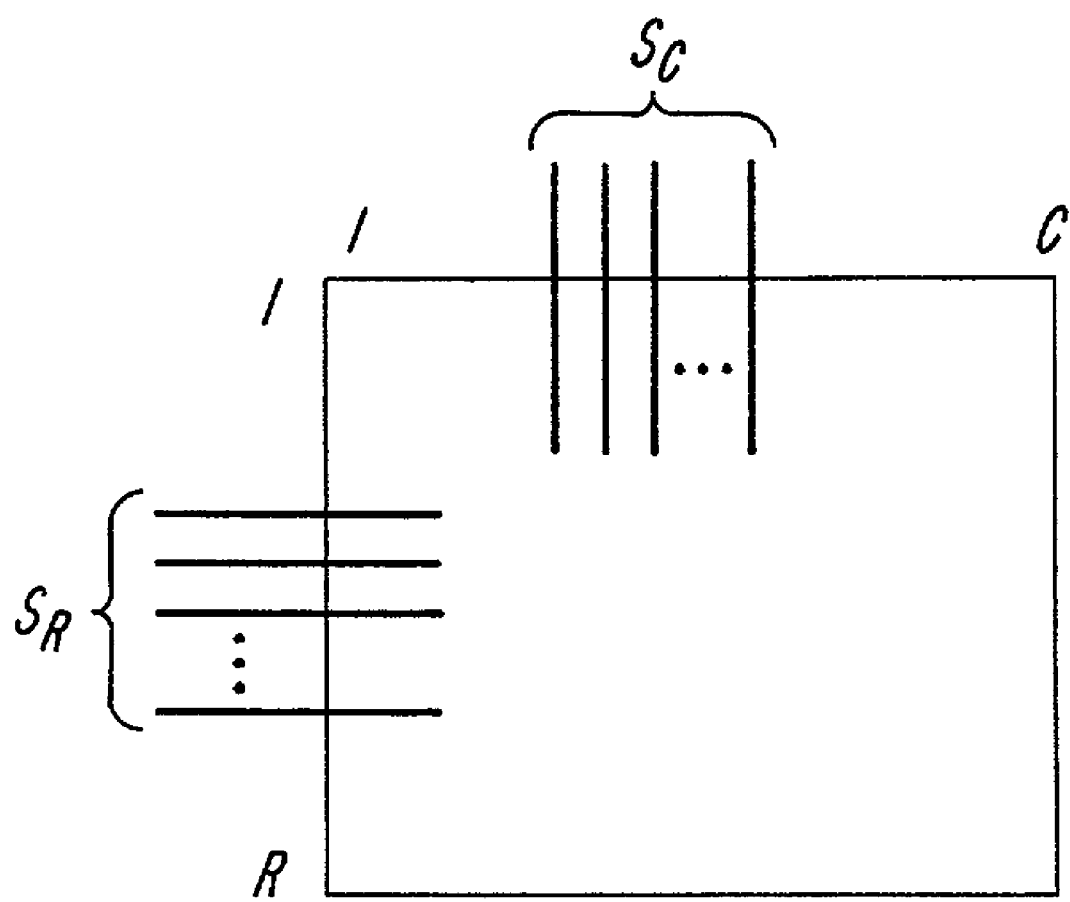
FIG. 10 illustrates a portion of memory having R rows and C columns.

Recall from the above that the error table is sized such that all repairable (and some not repairable) error patterns to fit. The following describes a manner in which the size of the error table may be calculated to achieve this result. FIG. 10 depicts a memory sub-block having R rows and C columns. The sub-block includes spare columns $S_C$ and spare rows $S_R$ for repairing failed memory cells within an analysis block.

As described above, a separate error storage table is required for each sub-block included within an analysis block. FIGS. 3A and 3B depict the row update and column (or I/O) update portions of the error table, respectively. The format of the table entries include address/error-count pairs. An additional ID entry is included in the update table (either row or column) having the most spares. The ID entry provides a link between the row and column portions of the error storage table.

The following equations may be used to calculate the sizes of the count/address pairs in the row and column update tables:

$$RowCnt = \lceil \log_2(S_C+2) \rceil$$

$$RowAddr = \lceil \log_2(R) \rceil$$

$$ColumnCnt = \lceil \log_2(S_R+2) \rceil$$

$$ColumnAddr = \lceil \log_2(C) \rceil$$

where: $S_C$=Number of spare columns (or I/Os),
R=Number of rows in the sub-block,
$S_R$=Number of spare rows, and
C=Number of columns in the sub-block.

The values of the link ID's and number of link ID's required $N_{ID}$ may be calculated using the following equations:

$$ID = \begin{cases} \lceil \log_2(C_E) \rceil & \text{if } R_E \geq C_E \\ \lceil \log_2(R_E) \rceil & \text{if } C_E > R_E \end{cases}$$

$$N_{ID} = \begin{cases} C_E & \text{if } R_E \geq C_E \\ R_E & \text{if } C_E > R_E \end{cases}$$

where: $C_E$=Number of column (or I/O) entries=$S_R*(S_C+1)$,
$R_E$=Number of rows entries=$S_C*(S_R+1)$, and
$N_{ID}$=Number of link IDs.

Using the above equations, the size of the error storage table may be calculated as:

$$Size = \begin{cases} R_E*(RowCnt+RowAddr+ID) + C_E*(ColumnCnt+ColumnAddr) & \text{if } R_E \geq C_E \\ R_E*(RowCnt+RowAddr) + C_E*(ColumnCnt+ColumnAddr+ID) & \text{if } C_E > R_E \end{cases}$$

Certain terms have been used for convenience in describing the exemplary embodiments, but should not be used to limit the general concepts described herein. For example, any specific reference to "row" or "column" portions of memory or types of memory spares can be interpreted to embrace either of these portions of memory or types of memory spares. In the case of memory spares, the specific terms represent complementary types of memory spares in that if one type of memory spare is not used to repair a given memory cell location, the other complementary type of memory spare may be used to repair the location. Moreover, the term "cell" or "memory cell" can be interpreted to represent one or memory cells or locations in the memory.

Various aspects have been described in connection with a number of exemplary embodiments. To facilitate an understanding of these embodiments, many aspects were described in terms of sequences of actions that may be performed by elements of a computer system or microcontroller. For example, it will be recognized that in each of the embodiments, the various actions could be performed by specialized circuits (e.g., discrete logic gates interconnected to perform a specialized function), by program instructions being executed by one or more processors, or by a combination of both.

Moreover, the exemplary embodiments can be considered part of any form of computer readable storage medium having stored therein an appropriate set of computer instructions that would cause a processor to carry out the techniques 5 described herein. Thus, the various aspects may be embodied in many different forms, and all such forms are contemplated to be within the scope of what has been described. For each of the various aspects, any such form of embodiment may be referred to herein as "logic configured to" perform a described action, or alternatively as "logic that" performs a described action.

Although various exemplary embodiments have been described, it will be understood by those of ordinary skill in this art that these embodiments are merely illustrative and that many other embodiments are possible. The intended scope of the invention is defined by the following claims rather than the preceding description, and all variations that fall within the scope of the claims are intended to be embraced therein.

What is claimed is:

1. A method for storing memory test information, the method comprising the steps of:

storing a portion of information related to locations and numbers of failed memory cells detected while testing memory, wherein the information is stored in a table having row and column portions, each row and column portion of the table including at least one address/error-count entry pair for storing an address of the respective row or column portion of memory where the failed memory cell is located and the number of failed memory cells detected in the respective row or column portion of memory; and updating the stored information as failed memory cells are detected to indicate a first type of memory spare is to be assigned to repair a failed memory cell, a second complementary type of memory spare is to be assigned to repair the failed memory cell, or the memory is not repairable, based in part on whether a number of failed memory cells in a respective row or column portion of memory where the failed memory cell is located exceeds a number of available complementary type memory spares;

wherein the first type of memory spare corresponds to one of a row and a column portion of memory and the second complementary type of memory spare corresponds to the other of the row and column portions of memory.

2. The method of claim 1, further comprising the step of:
determining if a match exists between at least one of the addresses of the row and column portions of memory where the failed memory cell is located and an address entry stored in the table.

3. The method of claim 2, wherein if a match exists, the method further comprises the step of:
incrementing the error-count entry paired with the matching address entry if the paired error-count entry is equal to the number of available complementary type memory spares.

4. The method of claim 2, wherein if a match exists in both the row and column portions of the table, the method further comprises the step of:
incrementing the error-count entries paired with the matching address entries if the paired error-count entries are each less than the respective number of available complementary type memory spares.

5. The method of claim 2, wherein if a match exists in one of the row and column portions of the table, the method further comprises the step of:
determining if the row or column portion of the table not including the matching address entry is full.

6. The method of claim 5, wherein if the row or column portion of the table not including the matching address entry is not full, the method further comprises the steps of:
incrementing the error-count entry paired with the matching address entry if the paired error-count entry is less than the number of available complementary type memory spares; and
adding an address/error-count entry pair to the portion of the table not including the matching address entry, the added entry pair including the address of the row or column portion of memory where the failed memory cell is located not matching an address entry in the table and an error-count of one.

7. The method of claim 5, wherein if the row or column portion of the table not including the matching address entry is full, the information stored in the table is updated to indicate that the memory is not repairable.

8. The method of claim 2, wherein if no match exists, the method further comprises the step of:
determining if at least one of the row and column portions of the table are full.

9. The method of claim 8, wherein if neither of the row or column portions of the table are full, the method further comprises the step of:

adding an address/error-count entry pair to both the row and column portions of the table, each added entry pair including the respective address of the row or column portion of memory where the failed memory cell is located and an error-count of one.

10. The method of claim 8, wherein if at least one of the row and column portions of the table are full, the information stored in the table is updated to indicate that the memory is not repairable.

11. The method of claim 2, wherein if a total number of one type of memory spare is greater than a total number of complementary type memory spares, the step of determining if a match exists comprises the step of:
comparing the address of the row or column portion of memory corresponding to the type of memory spare having the greater total number of spares with address entries in the table before comparing the address of the row or column portion of memory corresponding to the type of memory spare having a lesser total number of spares with address entries in the table.

12. The method of claim 2, wherein if the total number of the first and second types of memory spares are equal, the step of determining if a match exists comprises the steps of:
selecting one of the addresses of the row and column portions of memory where the failed memory cell is located at random; and
comparing the address of the row or column portion of memory selected at random with address entries in the table before comparing the address of the row or column portion of memory not selected at random with address entries in the table.

13. The method of claim 1, further comprising the step of:
linking address/error-count entry pairs included in the row portion of the table with associated address/error-count entry pairs included in the column portion of the table.

14. The method of claim 13, wherein a link identifier entry for storing a unique link ID is added to each address/error-count pair of the row or column portion of the table corresponding to the type of memory spare having a greater total number of spares for linking address/error-count entry pairs included in the row portion of the table with associated address/error-count entry pairs included in the column portion of the table.

15. The method of claim 14, wherein the number of unique link IDs is equal to the number of memory spares of the type having a lesser total number of spares.

16. The method of claim 1, wherein the table represents a portion of memory where at least one of the first type of memory spare intersects at least one of the second complementary type of memory spare.

17. The method of claim 1, wherein the size of the table is determined by the equation:
where $C_E$=Number of entries in column portion of table=$S_R*(S_C+1)$;

$$Size = \begin{cases} R_E*(RowCnt + RowAddr + ID) + C_E*(ColumnCnt + ColumnAddr) & \text{if } R_E \geq C_E \\ R_E*(RowCnt + RowAddr) + C_E*(ColumnCnt + ColumnAddr + ID) & \text{if } C_E > R_E \end{cases}$$

$R_E$=Number of entries in row portion of table=$S_C*(S_R+1)$;

RowCnt=Size of error-count in row portion of table=$\log_2(S_C+2)$;

RowAddr=Size of address in row portion of table=$\log_2(R)$;

ColumnCnt=Size of error-count in column portion of table=$\log_2(S_R+2)$;

ColumnAddr=Size of address in column portion of table=$\log_2(C)$;

R=Number of rows in row portion of memory;

$S_R$=Number of first or second type of memory spares;

$S_C$=Number of complementary type of memory spares;

C=Number of columns in column portion of memory; and

ID=Size of link ID=$\lceil\log_2(C_E)\rceil$, if $R_E C_E$; $\lceil\log_2(R_E)\rceil$, if $C_E > R_E$.

18. The method of claim 1, wherein the row portion of memory includes at least one row of memory and the column portion of memory includes at least one column of memory.

19. The method of claim 1, wherein the column portion of memory includes at least one input/output (I/O) device, the at least one I/O device providing an input and output path for at least one column of memory.

20. An apparatus for storing memory test information, comprising:

logic that stores a portion of information related to locations and numbers of failed memory cells detected while testing memory in a table having row and column portions, each row and column portion of the table including at least one address/error-count entry pair for storing an address of the respective row or column portion of memory where the failed memory cell is located and the number of failed memory cells detected in the respective row or column portion of memory; and logic that updates the stored information as failed memory cells are detected to indicate a first type of memory spare is to be assigned to repair a failed memory cell, a second complementary type of memory spare is to be assigned to repair the failed memory cell, or the memory is not repairable, based in part on whether a number of failed memory cells in a respective row or column portion of memory where the failed memory cell is located exceeds a number of available complementary type memory spares;

wherein the first type of memory spare corresponds to one of a row and a column portion of memory and the second complementary type of memory spare corresponds to the other of the row and column portions of memory.

21. The apparatus of claim 20, further comprising:

logic that determines if a match exists between at least one of the addresses of the row and column portions of memory where the failed memory cell is located and an address entry stored in the table.

22. The apparatus of claim 21, further comprising:

logic that increments the error-count entry paired with the matching address entry when a match exists if the paired error-count entry is equal to the number of available complementary type memory spares.

23. The apparatus of claim 21, further comprising:

logic that increments the error-count entries paired with the matching address entries when a match exists in both the row and column portions of the table if the paired error-count entries are each less than the respective number of available complementary type memory spares.

24. The apparatus of claim 21, further comprising:

logic that determines if the row or column portion of the table not including the matching address entry is full when a match exists in one of the row and column portions of the table.

25. The apparatus of claim 24, further comprising:

logic that increments the error-count entry paired with the matching address entry when a match exists in one of the row and column portions of the table if the paired error-count entry is less than the number of available complementary type memory spares; and logic that adds an address/error-count entry pair to the portion of the table not including the matching address entry when a match exists in one of the row and column portions of the table, the added entry pair including the address of the row or column portion of memory where the failed memory cell is located not matching an address entry in the table and an error-count of one.

26. The apparatus of claim 24, further comprising:

logic that indicates that the memory is not repairable when the row or column portion of the table not including the matching address entry is full.

27. The apparatus of claim 21, further comprising:

logic that determines if at least one of the row and column portions of the table are full when no match exists.

28. The apparatus of claim 27, further comprising:

logic that adds an address/error-count entry pair to both the row and column portions of the table when no match exists, each added entry pair including the respective address of the row or column portion of memory where the failed memory cell is located and an error-count of one.

29. The apparatus of claim 27, further comprising:

logic that indicates that the memory is not repairable when at least one of the row and column portions of the table are full.

30. The apparatus of claim 21, wherein the logic that determines if a match exists comprises:

logic that compares the address of the row or column portion of memory corresponding to the type of memory spare having the greater total number of spares with address entries in the table before comparing the address of the row or column portion of memory corresponding to the type of memory spare having a lesser total number of spares with address entries in the table when a total number of one type of memory spare is greater than a total number of complementary type memory spares.

31. The apparatus of claim 21, wherein the logic that determines if a match exists comprises:

logic that selects one of the addresses of the row and column portions of memory where the failed memory cell is located at random when the total number of the first and second types of memory spares are equal; and logic that compares the address of the row or column portion of memory selected at random with address entries in the table before comparing the address of the row or column portion of memory not selected at random with address entries in the table when the total number of the first and second types of memory spares are equal.

32. The apparatus of claim 20, further comprising:
logic that links address/error-count entry pairs included in the row portion of the table with associated address/error-count entry pairs included in the column portion of the table.

33. The apparatus of claim 32, further comprising:
logic that adds a link identifier entry for storing a unique link ID to each address/error-count pair of the row or column portion of the table corresponding to the type of memory spare having a greater total number of spares for linking address/error-count entry pairs included in the row portion of the table with associated address/error-count entry pairs included in the column portion of the table.

34. The apparatus of claim 33, wherein the number of unique link IDs is equal to the number of memory spares of the type having a lesser total number of spares.

35. The apparatus of claim 20, wherein the table represents a portion of memory where at least one of the first type of memory spare intersects at least one of the second complementary type of memory spare.

36. A method for storing information that identifies the location of failed cells in a memory, comprising the steps of:
creating a pair of tables that are respectively associated with rows and columns of the memory, each table containing fields for addresses of associated rows or columns and error counts for the addresses, and linking information that links an address in one table to an address in the other table;
upon detecting a failed memory cell, storing the row address of the failed cell and a count value as in the table associated with memory rows, storing the column address of the failed cell and a count value as an entry associated with memory columns, and storing information in at least one of the tables linking the stored entry in said one table to the stored entry in the other table; and
upon detecting a further failed memory cell, checking said tables to detect whether the row and column addresses of the further failed cell are stored in the respective tables and, for each detected address, incrementing the count value corresponding to the detected address.

37. The method of claim 36, wherein the memory has one or more spare rows of cells and one or more spare columns of cells for repair allocation, and wherein the table associated with rows has a maximum number of entries equal to $S_R*(S_C+1)$, and the table associated with columns has a maximum number of entries equal to $S_C*(S_R+1)$, where:
$S_R$=number of spare rows of cells
$S_C$=number of spare columns of cells.

38. The method of claim 37, further including the step of determining whether an incremented count value in the row or column table exceeds the number of allocatable spare columns or rows, respectively, and, if so, designating the row or column, respectively, at the address corresponding to the exceeding count value, to be repaired by one of a spare row or column, respectively.

39. The method of claim 38 wherein, if no such repair designation is made, adding an entry to the other table for the address at which the further failed cell is located.

40. The method of claim 39, further including the step, upon detecting a further error, of determining whether said further failed cell requires an entry in a table already containing its maximum number of entries and, if so, designating the memory as being unrepairable.

41. A memory device having memory cells arranged in rows and columns, and at least one spare row of cells and at least one spare column of cells for repair allocation, and further containing information relating to failed memory cells, comprising:
a first table associated with the rows of memory cells and having stored therein one or more entries that each identify an address of row containing a failed cell and the number of failed cells in the row;
a second table associated with the columns of memory cells and having stored therein one or more entries that each identify an address of column containing a failed cell and the number of failed cells in the column;
wherein at least one of said tables includes information that links each entry in the table to a corresponding entry in the other table.

42. The memory device of claim 41, wherein the first table has a maximum number of entries equal to $S_R*(S_C+1)$, where
$S_R$=number of spare rows of cells
$S_C$=number of spare columns of cells.

* * * * *